(12) United States Patent
Rodgers, III et al.

(10) Patent No.: US 7,502,264 B2
(45) Date of Patent: Mar. 10, 2009

(54) ON-CHIP EE-PROM PROGRAMMING WAVEFORM GENERATION

(75) Inventors: Bertram J. Rodgers, III, San Francisco, CA (US); Edgardo A. Laber, San Jose, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 11/565,039

(22) Filed: Nov. 30, 2006

(65) Prior Publication Data

US 2008/0037325 A1  Feb. 14, 2008

Related U.S. Application Data

(63) Continuation of application No. 11/044,948, filed on Jan. 26, 2005, now Pat. No. 7,158,412.

(60) Provisional application No. 60/581,044, filed on Jun. 17, 2004.

(51) Int. Cl.
*G11C 11/34* (2006.01)

(52) U.S. Cl. ............................ 365/185.18; 365/185.11; 365/185.19

(58) Field of Classification Search ............ 365/185.18, 365/189.11, 185.19
See application file for complete search history.

(56) References Cited

U.S. PATENT DOCUMENTS 7,015,732 B1 * 3/2006 Holloway et al. ........... 327/143
7,158,412 B2 * 1/2007 Rodgers, III et al. ... 365/185.18

\* cited by examiner

*Primary Examiner*—Huan Hoang
(74) *Attorney, Agent, or Firm*—Townsend and Townsend and Crew LLP; J. Matthew Zigmant

(57) ABSTRACT

Circuits, methods, and apparatus that provide waveforms having controlled rise and fall times, as well as accurate peak voltages. One embodiment provides circuitry for generating a clock signal and a current that are adjusted for an on-chip capacitance variation. This current is then used to generate rising and falling edges of a waveform. The clock signal is used to determine timing of transitions in the waveform. A bandgap or similar reference voltage is used to determine the peak voltage. This waveform is then gained using an amplifier circuit, and the output of the amplifier circuit is used as a programming voltage waveform for an EE-PROM. One embodiment further uses non-overlapping clocks to drive a charge pump that is used to generate a supply voltage for the amplifier circuit that far exceeds the available on-chip supply voltages.

21 Claims, 9 Drawing Sheets

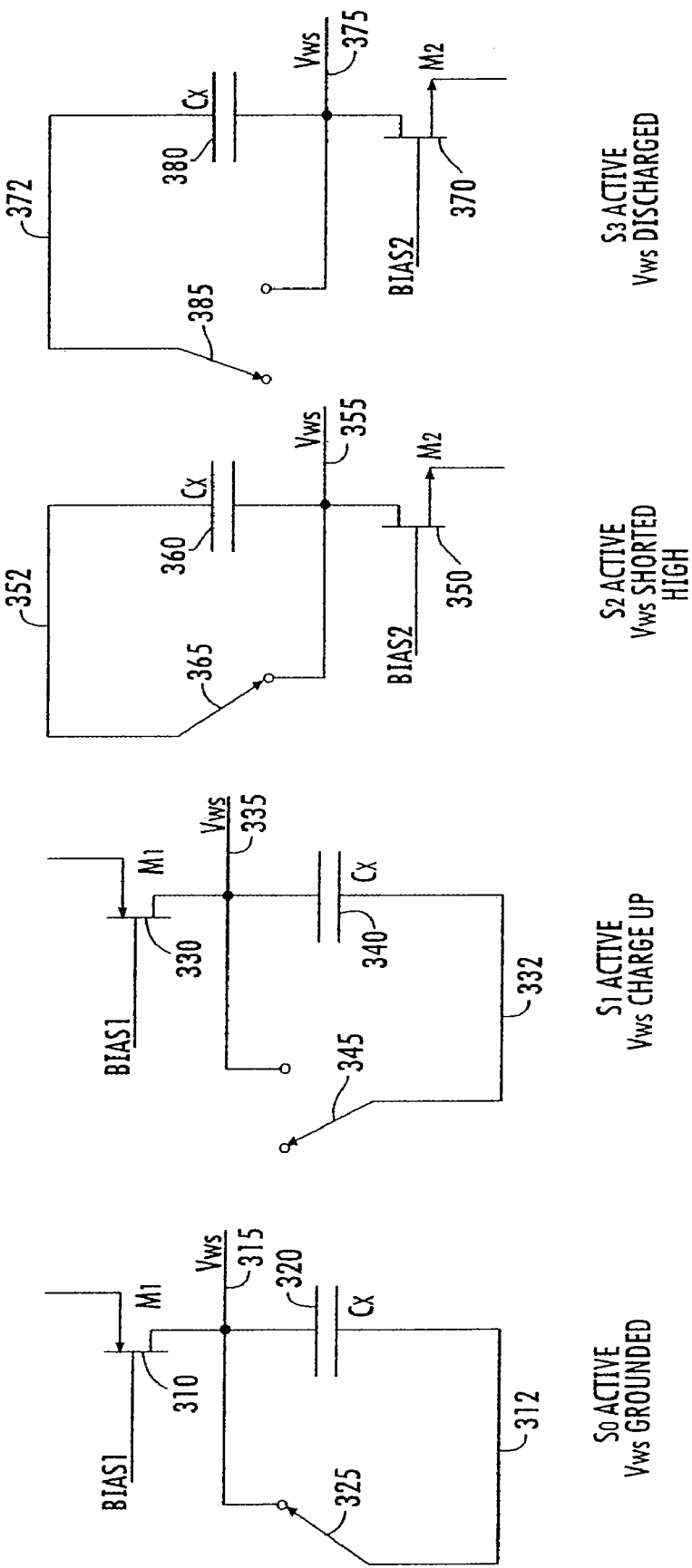

ON-CHIP EE-PROM PROGRAMMING WAVEFORM GENERATION

CROSS-REFERENCES TO RELATED APPLICATIONS

This application is a continuation of U.S. patent application Ser. No. 11/044,948, filed Jan. 26, 2005, now U.S. Pat. No. 7,158,412, which claims the benefit of U.S. provisional patent application 60/581,044, filed Jun. 17, 2004, both which are incorporated by reference in this application.

BACKGROUND

The present invention relates generally to generating waveforms on an integrated circuit, and more particularly to generating accurate waveforms for programming electrically-erasable programmable read-only memories (EE-PROMs).

EE-PROMs have proven extremely useful for non-volatile data storage in systems and integrated circuits. They have proven to be particularly useful for storing system data in battery management devices, references, and potentiometers.

But EE-PROMs are programmed using very high voltages, for example 14 volts, which are much higher than supply voltages available to an integrated circuit during normal operation. Also, it is desirable that waveforms used to program EE-PROMs have certain characteristics. For example, the peak voltage should be accurate: too high a voltage may break down or damage the individual memory cells, while too low a voltage results in unreliable programming.

Further, the rate at which the programming voltage transitions from an off state to the programming voltage is important. Specifically, excessively fast rising and falling edge rates may damage the oxide layer over the EE-PROM cells. One solution for avoiding this oxide damage is to simply slow the edge rates. Unfortunately, this leads to excessive programming times. For example, if a large memory can be programmed in 2 seconds, slowing edge rates to avoid oxide damage can lead to programming times of 5-10 seconds. When the programming is done a wafer sort or final test, this excessive programming time leads to increased test time and decreased test throughput. When the programming is done at a system level, this excessive programming time can be disruptive to system performance.

Thus, what is needed are circuits, methods, and apparatus for generating waveforms for use in programming EE-PROMs, as well as for other applications, where the waveforms have controlled, repeatable rise and fall times, as well as peak voltages that are very near a desired value.

SUMMARY

Accordingly, embodiments of the present invention provide circuits, methods, and apparatus that provide waveforms having controlled rise and fall times, as well as accurate peak voltages and switching times. An exemplary embodiment of the present invention provides circuitry for generating a clock signal and a current that are adjusted for an on-chip capacitance variation. These may also be adjusted for resistance, reference voltage, and other variations.

The current and clock signal are then used to generate a precise, well controlled waveform. Specifically, the current is used to generate its rising and falling edges. Also, the timing of the transitions from rising to peak and peak to falling portions of the waveform are accurately determined by a clock signal. A bandgap or similar reference voltage is used to determine the peak voltage of the waveform.

The accurately generated waveform is gained using an amplifier circuit. The output of the amplifier circuit is used as a programming voltage waveform for an EE-PROM. This exemplary embodiment further uses non-overlapping clocks to drive a charge pump that is used to generate a supply voltage for the amplifier circuit that far exceeds the available on-chip supply voltages.

While embodiments of the present invention are particularly suited to waveforms used to program EE-PROMs, it will be appreciated that embodiments of the present invention may be used to generate waveforms for other applications. Embodiments of the present invention may incorporate one or more of the various features described herein.

An exemplary embodiment of the present invention provides a method of programming an electrically-erasable programmable read-only memory. This method includes generating a first waveform by adjusting a first current to compensate for process variations in capacitance values, generating a second current proportional to the first current, generating a third current proportional to the first current, charging a capacitor from a first voltage to a second voltage during a first duration using the second current, holding the capacitor at the second voltage for a second duration, and discharging the capacitor from the second voltage to the first voltage during a third duration using the third current.

Another exemplary embodiment of the present invention provides an integrated circuit. This integrated circuit includes a waveform generator configured to provide a first waveform, an amplifier configured to receive the first waveform and generate a second waveform, and a charge pump configured to provide a power supply for the amplifier. The first waveform includes a rising edge having a rising edge rate and a falling edge having a falling edge rate, and the rising edge rate and the falling edge rate do not change significantly for capacitance variations on the integrated circuit.

A further exemplary embodiment of the present invention provides another integrated circuit. This integrated circuit includes a wave shape circuit having a plurality of control inputs and an output, an amplifier circuit coupled to the output of the wave shape circuit, a charge pump coupled to the amplifier, and a current adjustment circuit coupled to the wave shape circuit. The current adjustment circuit provides a current to the wave shape circuit that is adjusted for a capacitance process variation.

A better understanding of the nature and advantages of the present invention may be gained with reference to the following detailed description and the accompanying drawings.

BRIEF DESCRIPTION OF THE DRAWINGS

FIGS. 3A-3D illustrate simplified circuit models for the circuit in FIG. 2 during the generation of the portions of the waveform of FIG. 1, while

DESCRIPTION OF EXEMPLARY EMBODIMENTS

Figure 1:
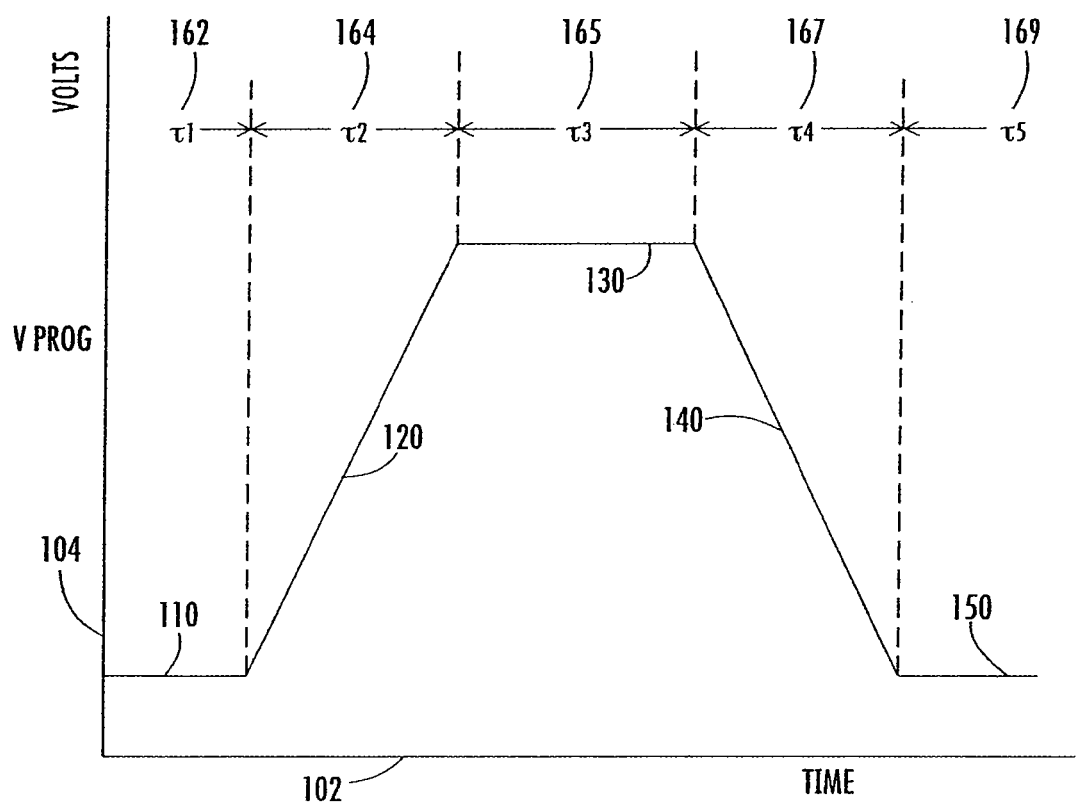
FIG. 1 illustrates a waveform that may be generated by an embodiment of the present invention.

FIG. 1 illustrates a waveform that may be generated by an embodiment of the present invention. The amplitude of the waveform is plotted on Y-axis 104 as a function of time along X-axis 102. This figure, as with the other included figures, is shown for illustrative purposes only, and does not limit either the possible embodiments of the present invention or the claims.

The waveform has an initial value indicated here as line 110. This initial value may be zero, that is, ground or VSS, or other appropriate voltage. For example, the value at 110 may equal a negative voltage that is required to turn off conduction in an active device. In this particular example, the waveform maintains approximately this initial value for a time $T_1$ 162.

Following $T_1$ 162, the voltage of the waveform increases, as shown by 120. This voltage increases for a time $T_2$ 164 to a final value indicated as 130. The rising edge 120 is well controlled. That is, different devices manufactured on different wafers having different values of on chip capacitances each have approximately the same edge rate. Again, it is important to control this rise time, particularly if the waveform is used to program an EE-PROM cell. If the rise time is too fast, the oxide over the memory cell can become stressed and damaged. If the rise time is too slow, an excessive amount of time is required to program the entire memory.

The rise time may be controlled, for example, by charging a capacitor with a current that has been adjusted to compensate for variations in on-chip capacitor values. This current may also be adjusted to compensate for variations in on-chip resistor values and their temperature coefficients. On-chip resistors can be trimmed, for example by using EEPROM registers, fuses, zeners, anti-fuses, or other appropriate structures. Further, different resistor types having different temperature coefficients can be combined to reduce the overall resistor temperature coefficient. For example, a resistor having a positive temperature coefficient can be combined with one having a negative temperature coefficient. Alternately an external resistor may be used. Further improvements to compensate for temperature effects may also be incorporated by embodiments of the present invention.

During time $T_3$ 165, the waveform maintains a peak value shown as 130. In a specific embodiment of the present invention, this peak value is a voltage that is needed to program an EE-PROM memory cell. For example, in one embodiment, this voltage is approximately 14 volts. This voltage may be accurately set using a multiple of a bandgap voltage. In various embodiments, the voltage 130 may be maintained by holding a charge on a capacitor, or by forcing a voltage across the capacitor to a fixed potential.

The time $T_3$ 165 that the waveform is at the high voltage indicated by 130 is also accurately set. If this time is too short, the cell may not be programmed completely and errors may occur. If this time is too long, the programming time for the entire memory becomes excessive. As discussed above, this may result in test throughput problems or system errors. In a specific embodiment of the present invention, this duration is accurately set by counting a number of clock cycles. In this embodiment, the clock frequency is adjusted to compensate for on-chip capacitor variations. As before, further embodiments of the present invention may also compensate for resistor, voltage, and temperature variations.

Specifically, in one embodiment, when the rising edge 120 begins, a counter starts counting clock cycles. After a first number of clock cycles, the waveform is expected to be at the voltage indicated by 130. At this time, the waveform is held or forced to the voltage indicated as 130. After a second number of clock cycles, the falling edge 140 begins.

As with the rising edge 120, the falling edge 140 is adjusted to be slow enough to prevent oxide stress while fast enough to allow rapid memory programming. After time $T_4$ 167, the waveform again reaches its low value, indicated here as 150. That is, after a third number of clock cycles, the waveform is held or forced to zero or other low voltage.

It should be noted that "steps" or discontinuities in the waveform may result if the waveform is forced high or low during times $T_3$ 165 and $T_5$ 169. Specifically, if the waveform has not reached its peak value at the end of time $T_2$ 164, line 120 has a break or step to line 130. Again, this excessive rate may damage the memory cells. Accordingly, an exemplary embodiment of the present invention sets the rise time of 120 to be faster than would be needed to reach the peak voltage 130 by the end of time $T_2$ 164. In this way, the possible discontinuities are eliminated or reduced. Similarly, embodiments of the present invention may adjust the falling edge rate of 140.

Figure 2:
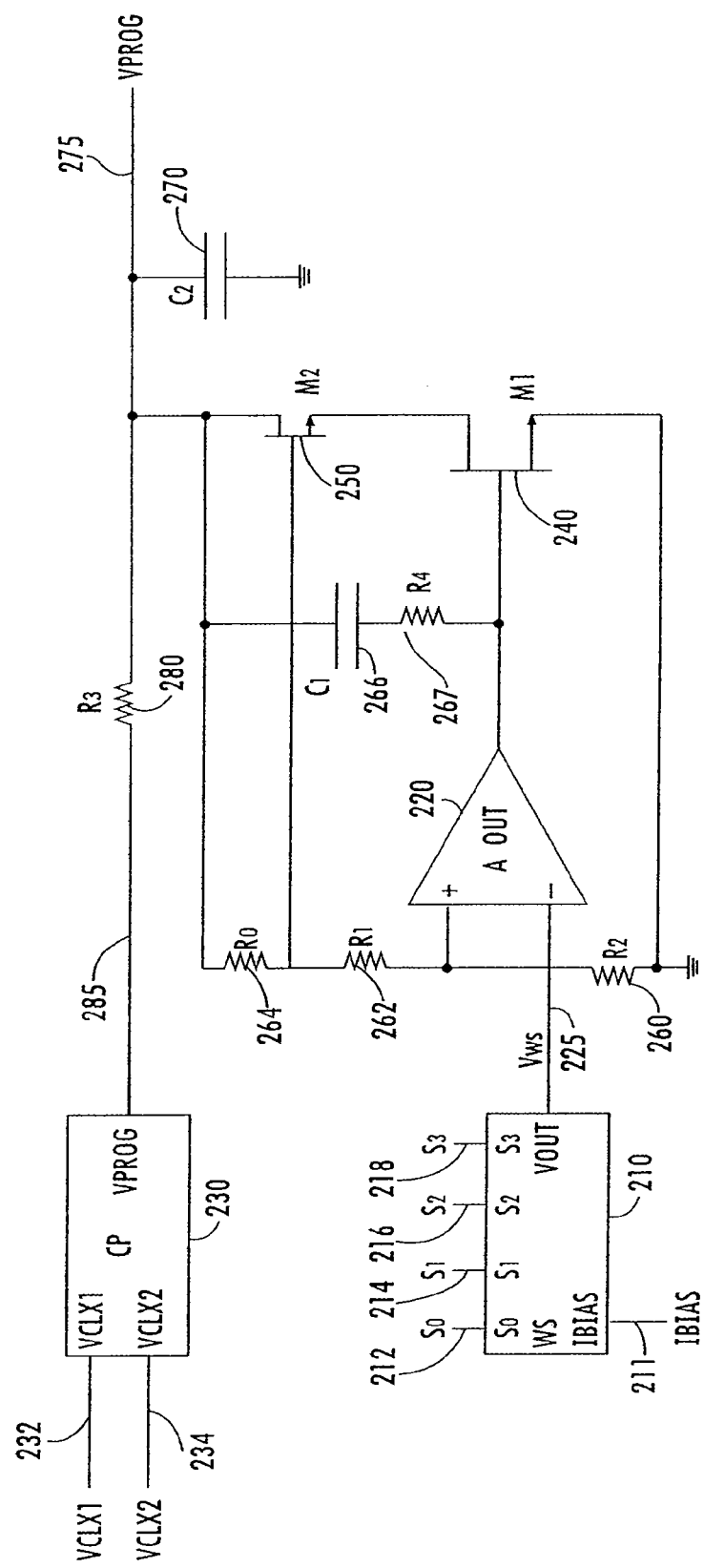
FIG. 2 is a schematic of a waveform generator consistent with an embodiment of the present invention.

FIG. 2 is a schematic of a waveform generator consistent with an embodiment of the present invention. Include is a wave shape circuit 210, amplifier 220 and associated circuitry, and charge pump 230.

The wave shape circuitry receives a number of control inputs, each of which may be analog or digital signals. In this is specific embodiment, four digital inputs are received, namely $S_0$ on line 212, $S_1$ on line 214, $S_2$ on line 216, and $S_3$ on line 218. A bias current is received on line 211. The wave shape circuitry provides a wave shape signal on line 225 to the amplifier 220.

In a specific embodiment of the present invention, each of the four digital control inputs to the wave shape circuit 210 are successively active. Specifically, $S_0$ on line 212 is active high for a time period, after which $S_1$ on line 214 is active high, followed by $S_2$ on line 216, which in turn is followed by $S_3$ on line 218.

In this embodiment, the waveform generation begins with $S_0$ on line 212 active. This forces the value of the wave shape signal on line 225 to be zero or other appropriate voltage as discussed above. After some time, $S_1$ on line 214 becomes active, and the wave shape signal on line 225 increases in voltage to a peak value.

After a specific duration, for example after a number of clock cycles, $S_2$ on line 216 is active. At this time, the wave shape signal on line 225 is held to a maximum value. Again, after a predetermined number of clock cycles, $S_3$ on line 218 becomes active. When $S_3$ on line 218 is active, the wave shape signal on line 225 decreases in value from its peak voltage back to zero. After another predetermined period, or predetermined number of clock cycles, $S_0$ on line 212 is reasserted active, and the low voltage is help until another cell is to be programmed. During each of these times, the amplifier circuitry gains the wave shape signal on line 225 to a programmable voltage on line 275.

The amplifier 220 receives the wave shape signal on line 225 from the wave shape circuit 210, and gains it to a programming voltage for EE-PROMs VPROG on line 275. Specifically, the amplifier 220 and associated circuitry including transistors M1 240 and M2 250, resistors R0 264, R1 262, and R2 260, as well as compensation capacitor C1 266 and resistor R4 267, gain the wave shape signal received on line 225 and provide it as a program voltage output VPROG on line 275.

The charge pump 230 receives differential non-overlapping clocks VCLK1 on line 232 and VCLK2 on line 234, and provides a voltage higher than the supply voltage provided to the integrated circuit that includes this waveform generating circuitry. The output of the charge pump on line 285 is isolated by resistor R3 280, which in turn is coupled to the output VPROG on line 275.

FIGS. 3A-3D illustrate simplified circuit models for the circuit in FIG. 2 during the generation of the portions of the waveform of FIG. 1. In FIG. 3A, $S_0$ is active. In this mode switch 325 shorts the capacitor $C_X$ 320 to ground, thus forcing the output voltage on line 315 to zero.

In FIG. 3B, $S_1$ is active. Switch 345 is open and current provided by M1 330 flows into capacitor $C_X$ 340, thus charging the wave shape voltage on line 335. Again, the current provided by M1 330 is adjusted for process variations in the value of the capacitor $C_X$ 340. The capacitor $C_X$ 340 may be formed by a thin-oxide capacitor, a MOS capacitor, poly capacitor, or other integrated circuit capacitive layers.

In FIG. 3C, $S_2$ is active. Here the switch 365 is closed, thus shorting the capacitor $C_X$ 360 and forcing the wave shape signal on line 355 to the voltage on line 352. In a specific embodiment of the present invention, the voltage on line 352 is set by a bandgap reference. In this way, the peak voltage generated by the wave shape circuitry is consistent from device to device and is temperature compensated.

In FIG. 3D, $S_3$ is active, switch 385 is open, allowing transistor M2 370 to discharge capacitor $C_X$ 380. In this way, the wave shape voltage on line 375 is discharged back to zero volts.

Figure 3E:
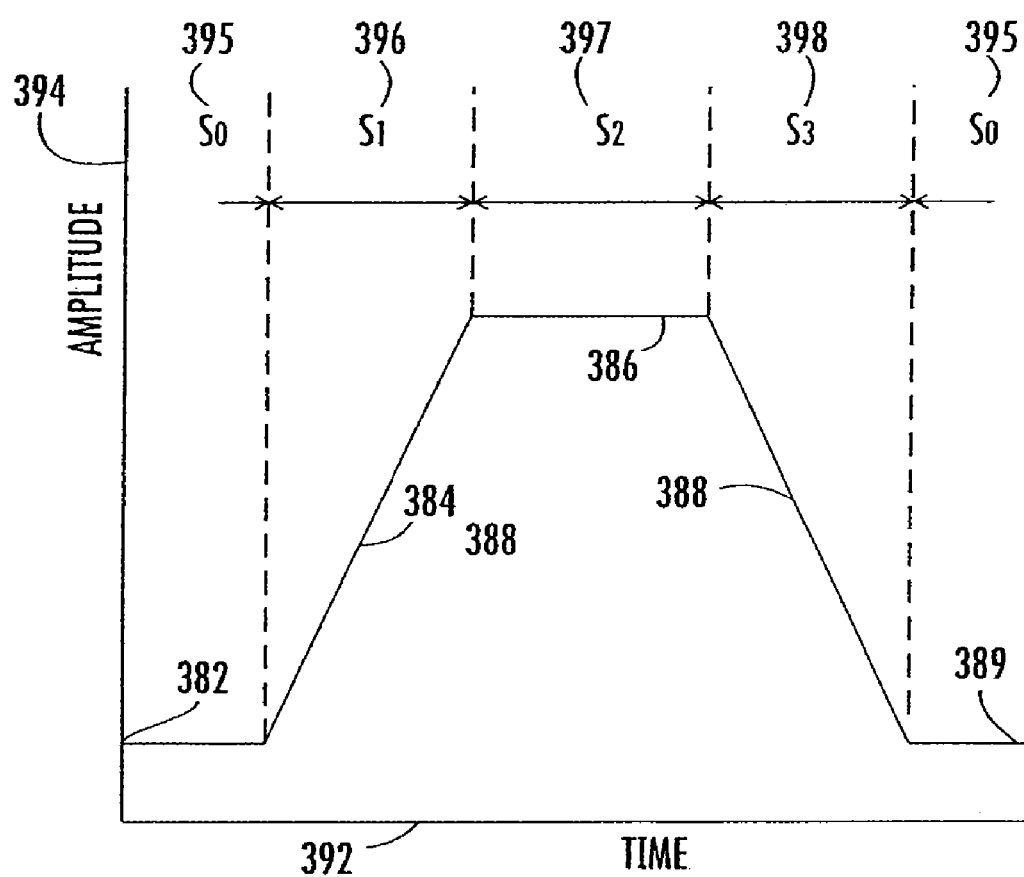
FIG. 3E illustrates which simplified model circuits are active for each portion of the generated waveform.

FIG. 3E shows which simplified model circuits are active for each portion of a waveform generated according to an embodiment of the present invention. The waveform amplitude is plotted on Y-axis 394 as a function of time on X-axis 392. Initially, switch $S_0$ is active and the waveform output line is shorted to ground or other potential. Following this, switch $S_1$ is active. At that time, the capacitor is charged, and the waveform voltage increases, as shown by 384. At some point the capacitor is fully charged and the value indicated by 386 is reached. After this, switch $S_2$ is active and the waveform output line is shorted high.

It is desirable that switch $S_2$ remain inactive until the capacitor is fully charged, otherwise a "step" may appear in the generated waveform. After this, switch $S_3$ is active and the capacitor discharges. After discharge, the capacitor is again shorted to ground. Again, it is desirable to discharge the capacitor before shorting it to ground to avoid a step or discontinuity.

Again, each of the durations that a switch is active may be determined by counting a number of cycles of a clock signal. As before, the clock circuit used to generate the clock signal may be biased or otherwise adjusted such that the frequency of the clock signal is compensated to reduce capacitance, resistance, voltage, and other process variations. This allows multiple waveform generators on multiple devices having different on-chip capacitor, resistors, and reference voltages to each generate similar waveforms.

Figure 4:
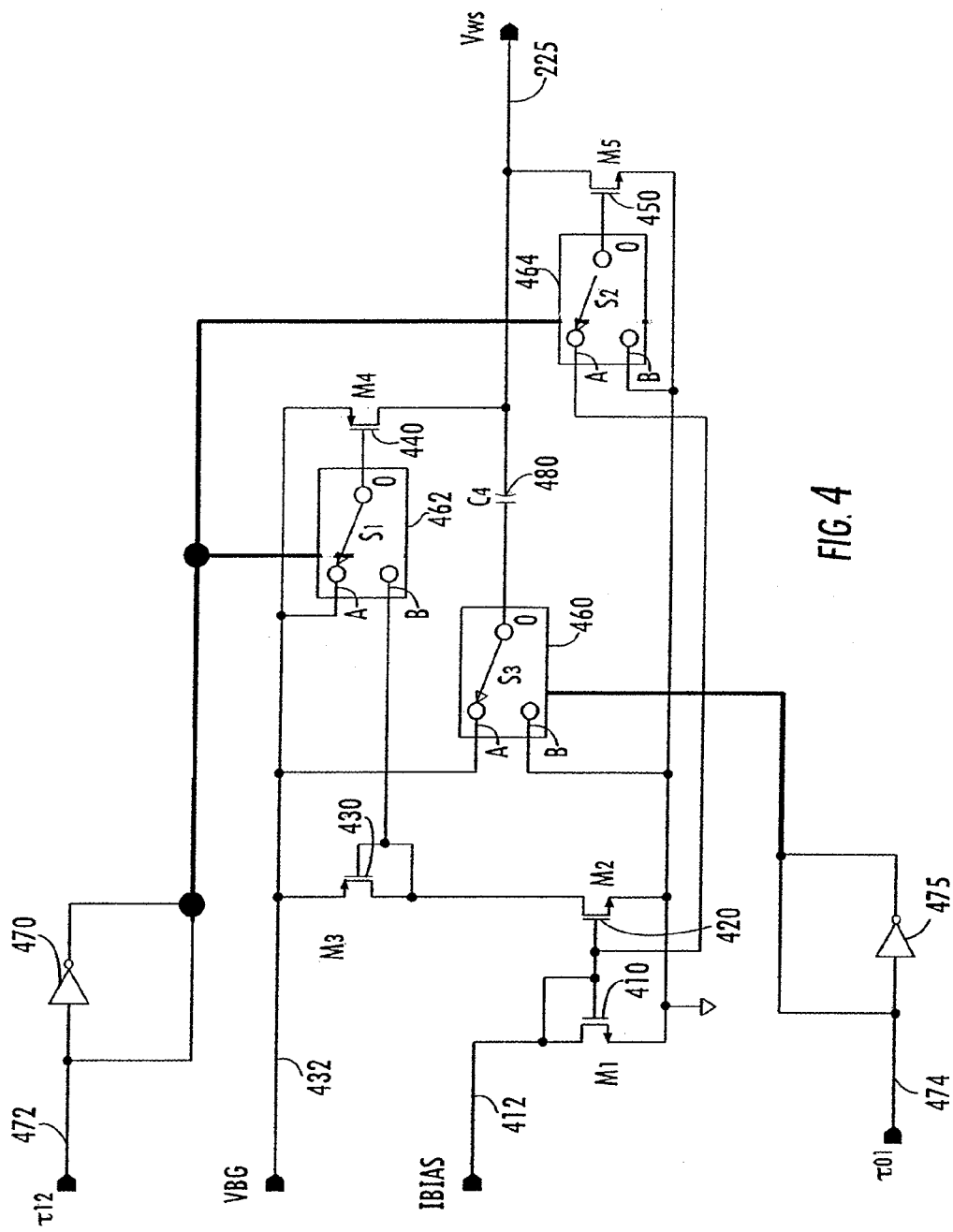
FIG. 4 is a schematic of a wave shape circuit that may be used by the waveform generator of FIG. 2 or as a wave shape circuit that may be used by other embodiments of the present invention.

FIG. 4 is a schematic of a wave shape circuit that may be used by the waveform generator of FIG. 2 or as a wave shape circuit that may be used by other embodiments of the present invention. This figure includes inverters 470 and 475, current mirror devices M1 410, M2 420, M3 430, M4 440, and M5 450, and switches 460, 462, and 464.

A bias current Ibias is received on line 412. This current is mirrored by devices M1 410 and M2 420. The current in the drain of M2 420 is mirrored by device M3 430. M3 430 generates a gate-to-source voltage that may be selectively coupled to the gate of M4 440. In this way, M4 440 may act as a current a charging current to capacitor C4 480 or as an off device (open circuit) under control of switch 462.

Similarly, device M5 450 may mirror the current in M2 420, thud providing a discharge current for capacitor C4 480 under control of switch 464. Switch 460 controls whether capacitor C4 480 has its second terminal coupled to a bandgap voltage applied on line 432 or ground.

In this and the other figures, CMOS devices are shown. In other embodiment of the present invention, other types of devices may be used. For example, bipolar devices, JFETs, or other types of devices may be used.

Figure 5:
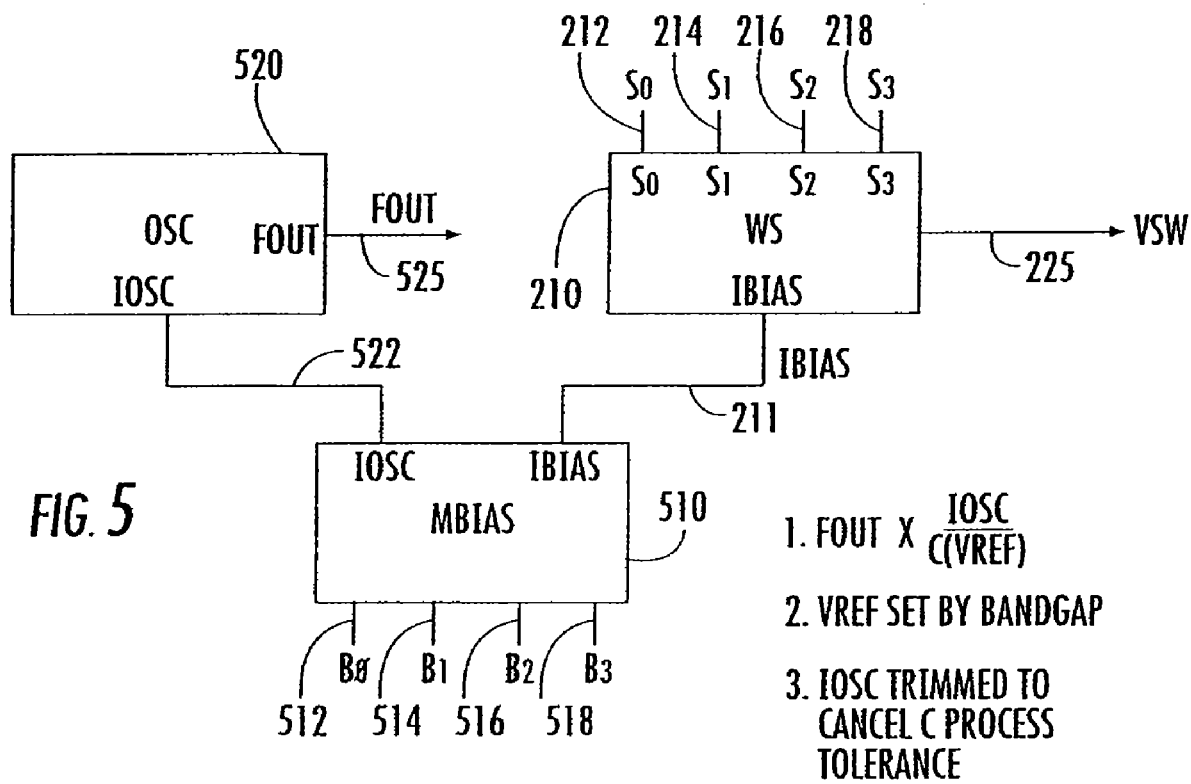
FIG. 5 is a simplified schematic of a current adjustment circuit that may be used by embodiments of the present invention.

FIG. 5 is a simplified schematic of a current adjustment circuit that may be used by embodiments of the present invention. This figure includes a master bias or MBIAS circuit 510, oscillator 520, and wave shape circuit 210. The wave shape circuit 210 may be the wave shape circuit 210 in FIG. 2, or other appropriate wave shape circuit.

The master bias circuit 510 provides a current to the oscillator 520 on line 522. This current partly determines the frequency of a clock signal FOUT on line 525. The master bias circuit 510 also provides the bias current Ibias on line 211 to the wave shape circuit 210. These currents are adjusted by bits B0 on line 512, B1 on line 514, B2 on line 516, and B3 on line 518. These bits may be controlled by programmable fuses, programmable memory sells, or other appropriate storage devices.

The frequency of the clock signal FOUT on line 525 is determined in part by the magnitude of the current supplied on line 522 by the master bias circuit MBIAS 510. Specifically, the oscillator 520 makes use of the equation:

$$I = CV/t, \text{ which may be rewritten as } F = Iosc/CV,$$

where F is the frequency of oscillation, C is a capacitor value, V is a voltage that is typically temperature insensitive, such as a voltage generated by a bandgap reference, and Iosc is the current supplied on line 522

The current Iosc is typically generated by using an amplifier to apply a bandgap voltage (or a voltage that is proportional to a bandgap voltage) across a resistance. This resistance may be either an on-chip or off-chip resistor. Using an off-chip resistor provides an advantage in that an off-chip resistor having a high accuracy and low temperature drift may be used. The resistance may instead be an on-chip resistance. Using an on-chip resistor eliminates the need for an external component and typically saves a device pin. On chip resistors typically have a larger variation in value caused by process variations. Also, on-chip resistors tend to have a larger temperature coefficient. Specific embodiments of the present invention reduce the variation in on-chip resistance value by trimming. Some of these specific embodiments use EEPROM registers, though other trimming circuits such as fuses, zeners, anti-fuses or other structures could be used. Also, some embodiments of the present invention reduce the temperature coefficient of an on-chip resistor by combining different resistor types having opposing temperature coefficients to form a low temperature coefficient on-chip resistance. On-chip capacitors tend to have a low temperature coefficient, while the temperature coefficient for a bandgap voltage is quite low.

Accordingly, if an off-chip resistor is used to generate Iosc on line 522, variations in the value of Iosc are limited, while if an on-chip resistor is used, variations in the value of Iosc are predominately caused by variations in on-chip resistances.

The current Iosc is received by the oscillator 520. Typically, the oscillator 520 is a circuit that generates a voltage by using this current to charge and discharge a capacitor through a voltage. Each time the voltage transitions, a clock edge is generated. Thus, the frequency of the oscillator is dependent on the current, capacitance, and voltage, as described by the equation above. The capacitor is typically on chip, and has an associated process variation, though again little temperature variation. As before, the voltage can be a bandgap or related voltage.

Accordingly, if an off-chip resistor is used to generate Iosc on line 522, variations in the frequency of the oscillator depend predominantly on capacitor variations. If an on-chip resistor is used, variations in the frequency of the oscillator depend predominantly on variation in on-chip capacitor and resistor values.

Thus, the current Iosc on line 512, and therefore the current Ibias on line 211 may be adjusted to compensate for on-chip capacitance, resistance, and other variations. Specifically, the frequency of a signal provided by the oscillator 520 on line 525 is monitored. The bits B0 on line 512 through B3 on line 518 are trimmed or otherwise set or adjusted such that a predetermined frequency is achieved. The oscillator may then be used as a clock in determining the durations of the various portions of a generated waveform. Similarly, the current Ibias on line 211 may be used to set the charge and discharge currents for the rising and falling edges of the generated waveform.

Figure 6:
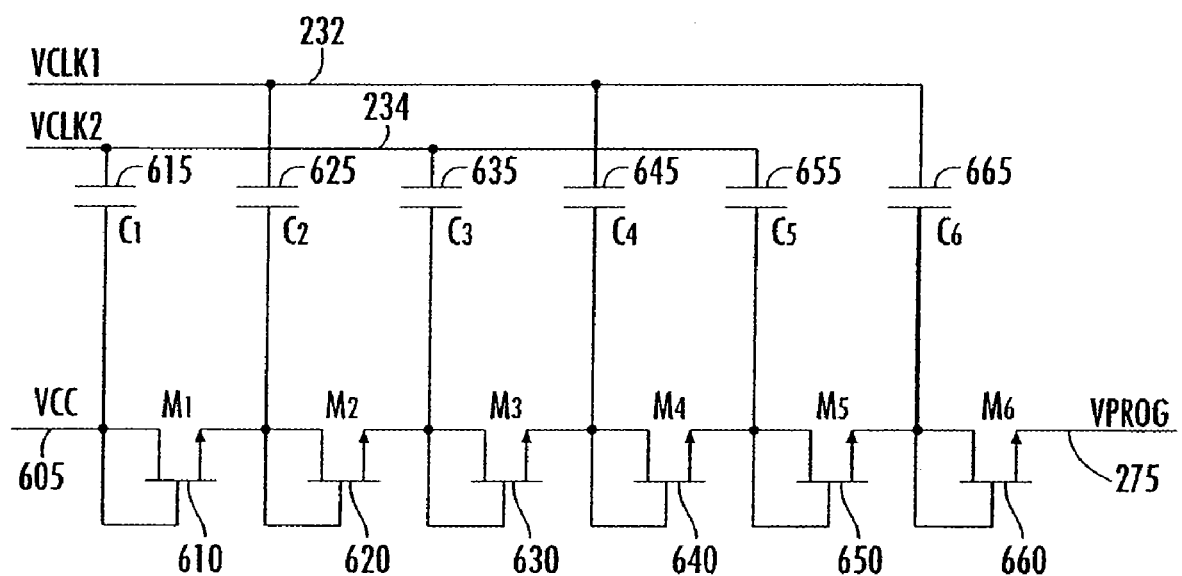
FIG. 6 is a simplified schematic of a charge pump that may be used as the charge pump in the circuit of FIG. 2 or as a charge pump in other embodiments of the present invention.

FIG. 6 is a simplified schematic of a charge pump that may be used as the charge pump in the circuit of FIG. 2 or as a charge pump in other embodiments of the present invention. This charge pump includes a diode string formed by diode-tied transistors M1 610, M2 620, M3 630, M4 640, M5 650, and M6 660, and capacitors C1 615, C2 625, C3 635, C4 645, C5 655, and C6 665.

Non-overlapping clocks are received by the charge pump, specifically VCLK1 on line 232 and VCLK2 on line 234. These clock lines couple to alternating capacitors. Specifically, VCLK1 on line 232 connects to C2 625, C4 645, and C6 665, while VCLK2 on line 234 connects to C1 615, C3 635, and C5 655. The other terminals of these capacitors connect to intermediate nodes between the transistors in the diode string.

This structure essentially forms a "bucket brigade" where the capacitors dump charge into the diode string, increasing the voltage VPROG on line 275 higher than the voltage VCC on line 605.

In the embodiment shown, six diodes and six capacitors are used. In other embodiments of the present invention, other numbers of capacitors and diodes may be used. Also, while diode-tied transistors are shown as being used for the diode string, other types of diodes may be used, for example, p-n junctions may be used.

Figure 7:
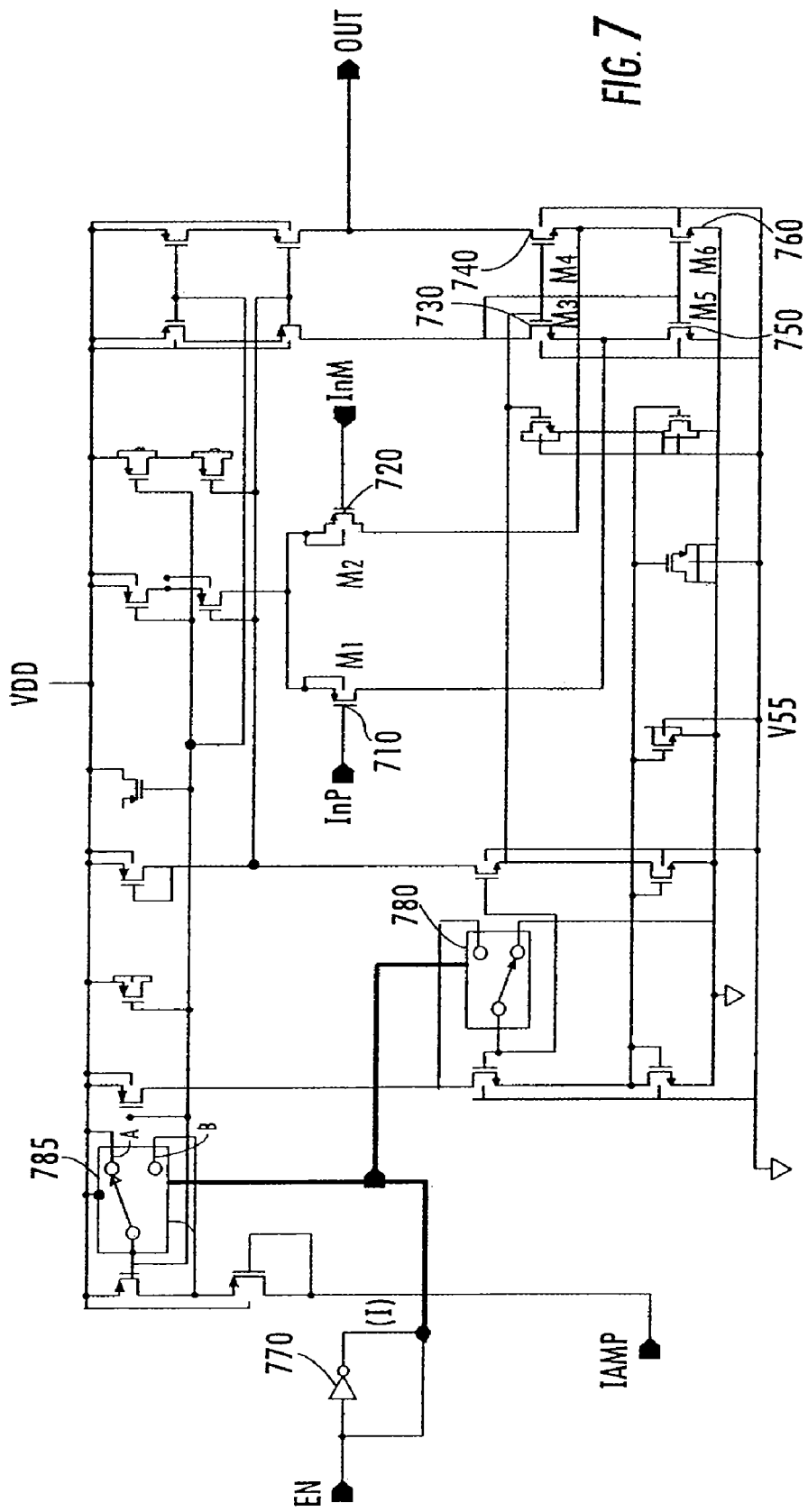
FIG. 7 is a simplified schematic of an amplifier that may be used as the amplifier in FIG. 2 or as an amplifier in other embodiments of the present invention.

FIG. 7 is a simplified schematic of an amplifier that may be used as the amplifier in FIG. 2 or as an amplifier in other embodiments of the present invention. This figure includes a folded-cascode amplifier with enable circuitry including inverter 770, and switches 780 and 785.

Figure 8:
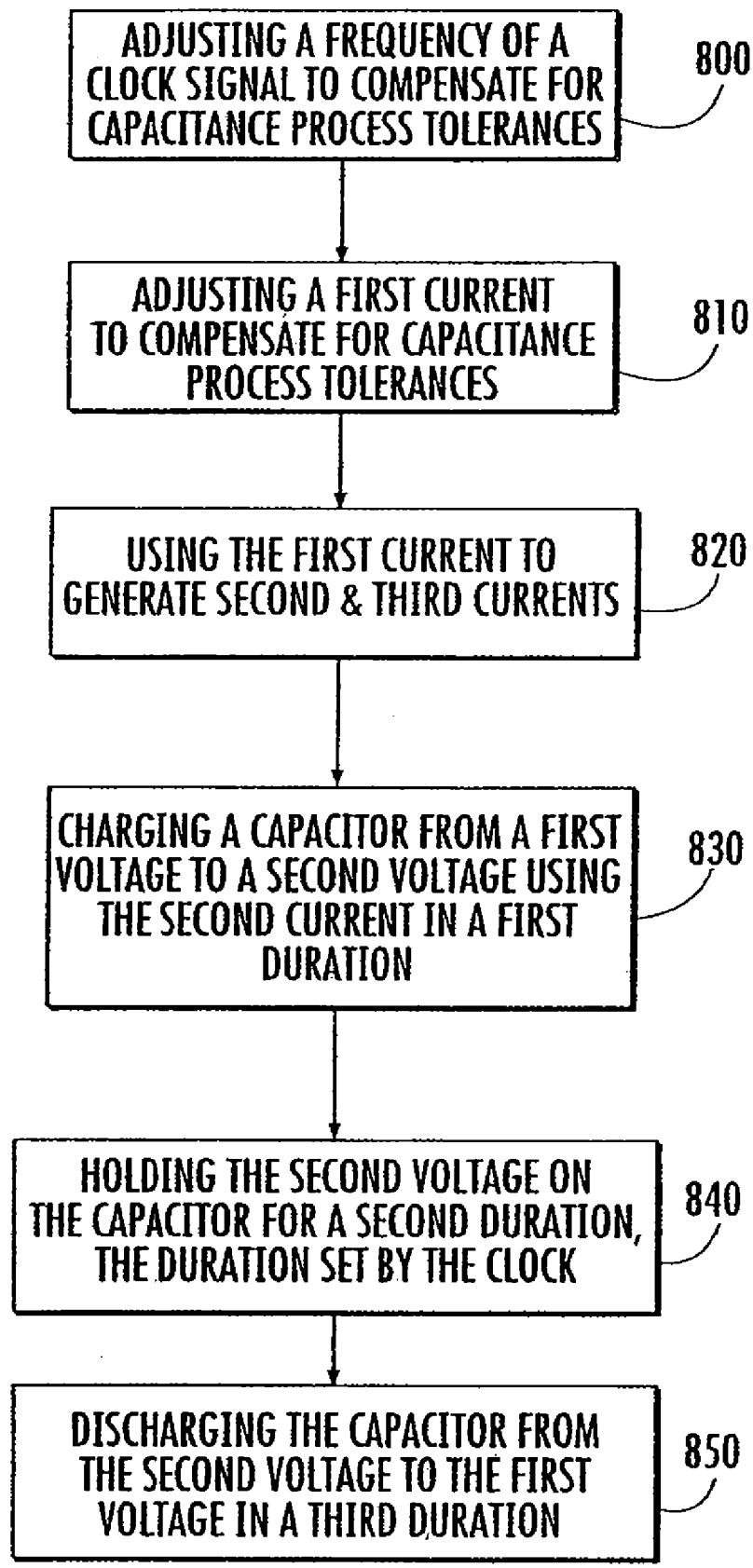
FIG. 8 is a flowchart illustrating a method of generating a waveform according to an embodiment of the present invention.

FIG. 8 is a flowchart illustrating a method of generating a waveform according to an embodiment of the present invention. In act 800, a frequency of a clock signal is adjusted. This adjustment may compensate for variations in on-chip capacitor values. This adjustment may also compensate for on-chip resistor, bandgap, and other tolerances. In act 810, a first current is adjusted, this adjustment is also to compensate for capacitor and possibly resistance, bandgap, and other tolerances. Again, in practical circuits, a current is adjusted while a frequency of a clock signal is monitored. When a desired frequency is achieved, the current is set, for example by blowing or not blowing a number of fuses.

In act 820, the first current is used to generate a second and a third current, which are proportional to the first current. For example, the second and third currents may be mirrored versions of the first current.

In act 830, a capacitor is charged from a first voltage to a second voltage using the second current. At this time, a number of clock cycles are counted. After a first number of clock cycles corresponding to a first duration have been counted, it may be assumed that the waveform has reached the second voltage. And this time, the waveform maybe forced to the second voltage. If this is done, in order to avoid discontinuities, it is desirable that the second current be slightly larger than the current that would be needed for the waveform to reach the second voltage within the first duration.

In act 840, the second voltage is held on the capacitor for a second duration, the second duration set by the clock. That is, a second number of clock cycles are counted in order to determine the second duration.

After the second duration, the capacitor is discharged from the second voltage to the first voltage in a third duration using the third current. After the third duration, the capacitor may be forced to the first voltage. Again, if this is done, in order to avoid discontinuities in the waveform, the third current may be slightly larger than the current that would be needed for the waveform to reach the first voltage within the third duration.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of generating an output voltage comprising:
   measuring a frequency of a plurality of clock cycles of a clock signal provided by an oscillator;
   adjusting a plurality of currents based on the frequency of the plurality of clock cycles;
   using a first current in the plurality of currents to generate a rising edge of an intermediate voltage;
   holding the intermediate voltage at a peak value for a first number of clock cycles of the oscillator; and
   using a second current in the plurality of currents to generate a falling edge of the intermediate voltage.

2. The method of claim 1 wherein the output voltage is used to program an electrically-erasable programmable read-only memory.

3. The method of claim 1 wherein the plurality of current sources are adjusted by trimming a bias line.

4. The method of claim 3 wherein the bias line is trimmed by blowing one or more fuses.

5. The method of claim 3 wherein the bias line is trimmed by zapping one or more zener diodes.

6. The method of claim 1 wherein the rising edge of the intermediate voltage is generated by charging a capacitor with the first current.

7. The method of claim 6 wherein the falling edge of the intermediate voltage is generated by discharging the capacitor with the second current.

8. The method of claim 1 further comprising:
amplifying the intermediate voltage to generate the output voltage.

9. An integrated circuit comprising:
a bias circuit for providing a plurality of currents;
an oscillator that receives a first current in the plurality of currents and provides a clock signal;
a charging circuit that receives a second current in the plurality of currents and charges a voltage at a first node;
a hold circuit that holds the first node to a first voltage for a first number of clock cycles of the clock signal provided by the oscillator; and
a discharging circuit that receives a third current in the plurality of currents and discharges the voltage at the first node.

10. The integrated circuit of claim 9 further comprising:
from the voltage at the first node, generating an output voltage to program an electrically-erasable programmable read-only memory.

11. The integrated circuit of claim 9 wherein the plurality of current sources are adjusted by measuring a frequency of the clock signal and trimming a bias line based on that frequency.

12. The integrated circuit of claim 11 wherein the bias line is trimmed by blowing one or more fuses.

13. The integrated circuit of claim 11 wherein the bias line is trimmed by zapping one or more zener diodes.

14. The integrated circuit of claim 9 wherein the charging circuit charges a capacitor with the second current.

15. The integrated circuit of claim 14 wherein the discharging circuit discharges the capacitor with the third current.

16. The integrated circuit of claim 9 further comprising:
amplifying the voltage at the first node to generate an output voltage.

17. A method of generating an output voltage for programming an electrically-erasable programmable read-only memory, the method comprising:
adjusting a first current to compensate for a first processing parameter;
mirroring the first current to a first current source and a second current source;
turning on the first current source to charge a first capacitor until a first number of clock cycles of a clock signal have been counted;
holding a voltage on the capacitor to a first voltage until a second number of clock cycles have been counted; and
turning on the second current source to discharge the first capacitor until a third number of clock cycles of a clock signal have been counted.

18. The method of claim 17 wherein the first processing parameter is capacitance.

19. The method of claim 17 wherein the first current is adjusted by measuring a frequency of the clock signal.

20. The method of claim 19 wherein the clock signal is generated by an oscillator.

21. The method of claim 17 further comprising:
amplifying the voltage on the capacitor to generate the output voltage.

* * * * *